US012244306B2

(12) United States Patent
Yamaji et al.

(10) Patent No.: US 12,244,306 B2
(45) Date of Patent: Mar. 4, 2025

(54) SUPERCONDUCTING QUANTUM CIRCUIT

(71) Applicant: NEC Corporation, Tokyo (JP)

(72) Inventors: Tomohiro Yamaji, Tokyo (JP); Kohei Matsuura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 246 days.

(21) Appl. No.: 18/090,320

(22) Filed: Dec. 28, 2022

(65) Prior Publication Data

US 2023/0216495 A1   Jul. 6, 2023

(30) Foreign Application Priority Data

Jan. 5, 2022   (JP) ................................. 2022-000740

(51) Int. Cl.
| | | |
|---|---|---|
| *G11C 5/06* | (2006.01) | |
| *G06N 10/40* | (2022.01) | |
| *H03K 17/92* | (2006.01) | |
| *H10N 60/12* | (2023.01) | |

(52) U.S. Cl.
CPC ............. *H03K 17/92* (2013.01); *G06N 10/40* (2022.01); *H10N 60/12* (2023.02)

(58) Field of Classification Search
CPC ....... G11C 5/063; G11C 7/18; G11C 11/4097; G11C 5/025; G11C 5/04
USPC ..................................................... 365/63, 51
See application file for complete search history.

(56) References Cited

U.S. PATENT DOCUMENTS

| | | | |
|---|---|---|---|
| 5,942,765 A | 8/1999 | Miyahara et al. | |
| 10,693,566 B2 * | 6/2020 | Sliwa ..................... | H03D 7/005 |
| 2017/0193388 A1 | 7/2017 | Filipp et al. | |
| 2018/0013052 A1 * | 1/2018 | Oliver .................... | G06N 10/00 |
| 2019/0294991 A1 | 9/2019 | Filipp et al. | |
| 2021/0116499 A1 | 4/2021 | Yamamoto et al. | |
| 2022/0318660 A1 | 10/2022 | Hasegawa et al. | |

FOREIGN PATENT DOCUMENTS

| | | |
|---|---|---|
| JP | H10-154397 A | 6/1998 |
| JP | 2019-508876 A | 3/2019 |
| JP | 2021-068765 A | 4/2021 |
| JP | 2021-516389 A | 7/2021 |
| WO | 2021/014889 A1 | 1/2021 |

OTHER PUBLICATIONS

Puri, et. al., "Quantum annealing with all-to-all connected nonlinear oscillators", Nature Communications 8, 15785 (2017).

* cited by examiner

*Primary Examiner* — Son T Dinh
(74) *Attorney, Agent, or Firm* — Sughrue Mion, PLLC

(57) ABSTRACT

A coupler includes first and second electrodes and a nonlinear element including a Josephson junction. The first and second electrodes are spaced apart from a ground plane surrounding peripheries thereof and arranged opposed to each other. The first/second electrode includes two opposing portions extended toward first and second qubits/third and fourth qubits. At least either one of a gap between the first electrode and the ground plane facing the first electrode and a gap between the second electrode and the ground plane facing the second electrode, includes a gap width of at least a value of a same extent as or a fraction of a size of the first electrode or the second electrode.

15 Claims, 13 Drawing Sheets

SUPERCONDUCTING QUANTUM CIRCUIT

FIELD

Cross Reference to Related Applications

This application is based upon and claims the benefit of the priority of Japanese patent application No. 2022-000740, filed on Jan. 5, 2022, the disclosure of which is incorporated herein in its entirety by reference thereto. The present invention relates to a superconducting quantum circuit.

BACKGROUND

A quantum bit (qubit), which is composed by a superconducting quantum circuit, is typically configured as a planar circuit on a semiconductor substrate with a superconducting material deposited thereon and has an inter-qubit coupling for performing a quantum computation. The inter-qubit coupling is used for performing a quantum computation under a wide variety of conditions. In performing quantum computation, switching between presence and non-presence of the coupling and/or switching a strength of the coupling are/is required. Therefore, regarding the inter-qubit coupling, as with a qubit, a coupler with a superconducting quantum circuit including a superconducting quantum interference device (SQUID) is often used. In such a coupler, a magnitude of coupling can be variably controlled by applying a magnetic flux to a SQUID loop in which two Josephson junctions are provided.

A quantum computer of a quantum logic gate scheme is often provided with a network in which qubits are coupled via a frequency tunable coupler by two-body interaction. FIG. 1 is a figure corresponding to FIG. 4 of Patent Literature (PTL) 1 (The reference numerals differ from those of the PTL 1). In FIG. 1, the device includes four fixed frequency quantum circuits (superconducting quantum bits) 111 to 114, each capacitively coupled with a tunable coupler 120. The tunable coupler 120 is provided with a SQUID loop. Modulation of the tunable coupler frequency is performed by changing a current passing through a magnetic flux bias line (a control line) 130 inductively coupled with the SQUID to change a magnetic flux penetrating through the SQUID loop.

As a quantum computer of an annealing scheme (that solves a combinatorial optimization problem by mapping the problem to an Ising model), those that have a network in which Josephson Parametric Oscillators (JPOs) coupled with each other by a four-body interaction is proposed (NPL 1), in addition to a network based on the two-body interaction as in the gate type.

FIG. 2A, FIG. 2B, and FIG. 2C are figures based on a, b, and c of FIG. 4 in the NPL 1. In FIG. 2A, FIG. 2B, and FIG. 2C, JPA (Josephson Parametric Amplifier) in FIG. 4 of NPL 1 is denoted as JPO. FIG. 2A illustrates a system in which four JPOs of resonance frequencies $\omega r, i (i=1, 2, 3, 4)$ interact via a single Josephson Junction (JJ) disposed at a center (central JJ). To realize a time-dependent two-photon drive, the SQUID loop of each JPO is driven by a flux pump with tunable amplitude and frequency. The pump frequency $\omega p, k (t)(k=1, 2, 3, 4)$ is varied close to twice the resonator frequency $2\omega r, i$ that is, twice the resonance frequency of JPOi. Local four-body couplings are realized through a nonlinear inductance of the Josephson junction JJ disposed at the center (central JJ). This four-body interaction is always-on coupling whose strength depends on nonlinearity of the Josephson junction JJ (central JJ) and detuning between the JPO and the Josephson junction (central JJ). A group of four JPOs (which is referred to as a plaquette in NPL 1) illustrated in FIG. 2A, is a main building block of an architecture. By using the plaquette (square lattice), it is possible to scale up to a pyramid form needed to implement an LHZ (Lechner, Hauke, Zoller) scheme. While JPOs within the plaquette have different frequencies of pump signals applied thereto, only four distinct frequencies of pump signals are required for an entire lattice. The LHZ scheme can implement a so-called all-to-all connected quantum annealing architecture, in which all logical spins are two-body coupled with each other, by making the JPOs in the plaquette interact with each other in the four-body interaction, for example, via a JRM (Josephson Ring Modulator) or a single Josephson junction. In the LHZ scheme, it is desirable for the four-body interaction within each plaquette to be variable, depending on a problem to be solved in order to provide a condition (constraint) that each JPO should satisfy to represent full coupling among logical bits. As an example, FIG. 2B illustrates all coupling combinations in a case where N=5 logical spins are fully coupled.

Energy E of the Ising model with M physical spins (Ising spins) is given by $$E = -\Sigma_{<i=1,M>} h_i s_i - \Sigma_{<i \neq j=1,M>} J_{ij} s_i s_j \quad (1)$$

where
- Jij is a parameter corresponding to a coupling coefficient for two-body interaction,
- hi is a parameter corresponding to a local field (local magnetic field), and
- $s_i (i=1 \sim M)$ is an i-th physical spin which takes +1 (up) or −1 (down).

FIG. 2C illustrates a case implementing the full coupling of N=5 logical spins with the LHZ scheme using the plaquette. In FIG. 2C, a coupler with the central Josephson junction (JJ) in FIG. 2A and four capacitors C is represented by a circle. In FIG. 2C, three bits (denoted by "Fixed") at the bottom side of the LHZ triangular structure are fixed to an up state. In an annealing-type quantum computer with a graph structure as illustrated in FIG. 2C, an Ising problem having full coupled structure with sparsely coupled four-body interaction network on a plane can be represented by redundantly embedding a product of two logical bits to a physical bit (two oscillation states of the JPO).

CITATION LIST

PTL 1: Japanese Patent Kokai Publication No. 2021-516389

NPL1: Puri, et. al., "Quantum annealing with all-to-all connected nonlinear oscillators", Nature Communications 8, 15785 (2018)

SUMMARY

At a moment, the four-body interaction coupler for JPO currently remains only a theoretical proposal, as disclosed in NPL 1, and has not been realized, yet.

Therefore, it is an object of the present disclosure to provide a superconducting quantum circuit with a four-body interaction coupler enabled to improve a noise resilience and to implement a practical application.

According to one aspect of the present invention, there is provided a superconducting quantum circuit that includes first to fourth qubits and a coupler for four-body interaction among the first to fourth qubits. The coupler includes, as a planer circuit configuration, first and second electrodes spaced apart from a ground plane disposed surrounding peripheries of the first and second electrodes, respectively, arranged opposing to each other and a nonlinear element bridged between the first and second electrode, the nonlinear element including a Josephson junction. The first electrode includes first and second opposing portions extended toward the first and second qubits, respectively from positions other than a side of the first electrode facing the second electrode. The second electrode includes third and fourth opposing portions extended toward the third and fourth qubits, respectively, from positions other than a side of the second electrode facing the first electrode. At least either one of a gap between the first electrode and the ground plane facing the first electrode and a gap between the second electrode and the ground plane facing the second electrode, includes a gap width of at least a value of a same extent as or a fraction of a size of the first electrode or the second electrode.

According to the present disclosure, it is possible to realize a superconducting quantum circuit provided with a four-body interaction coupler with a noise resilience improved and applicable to practical implementation. Still other features and advantages of the present invention will become readily apparent to those skilled in this art from the following detailed description in conjunction with the accompanying drawings wherein only example embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EXAMPLE EMBODIMENTS

Figure 1:
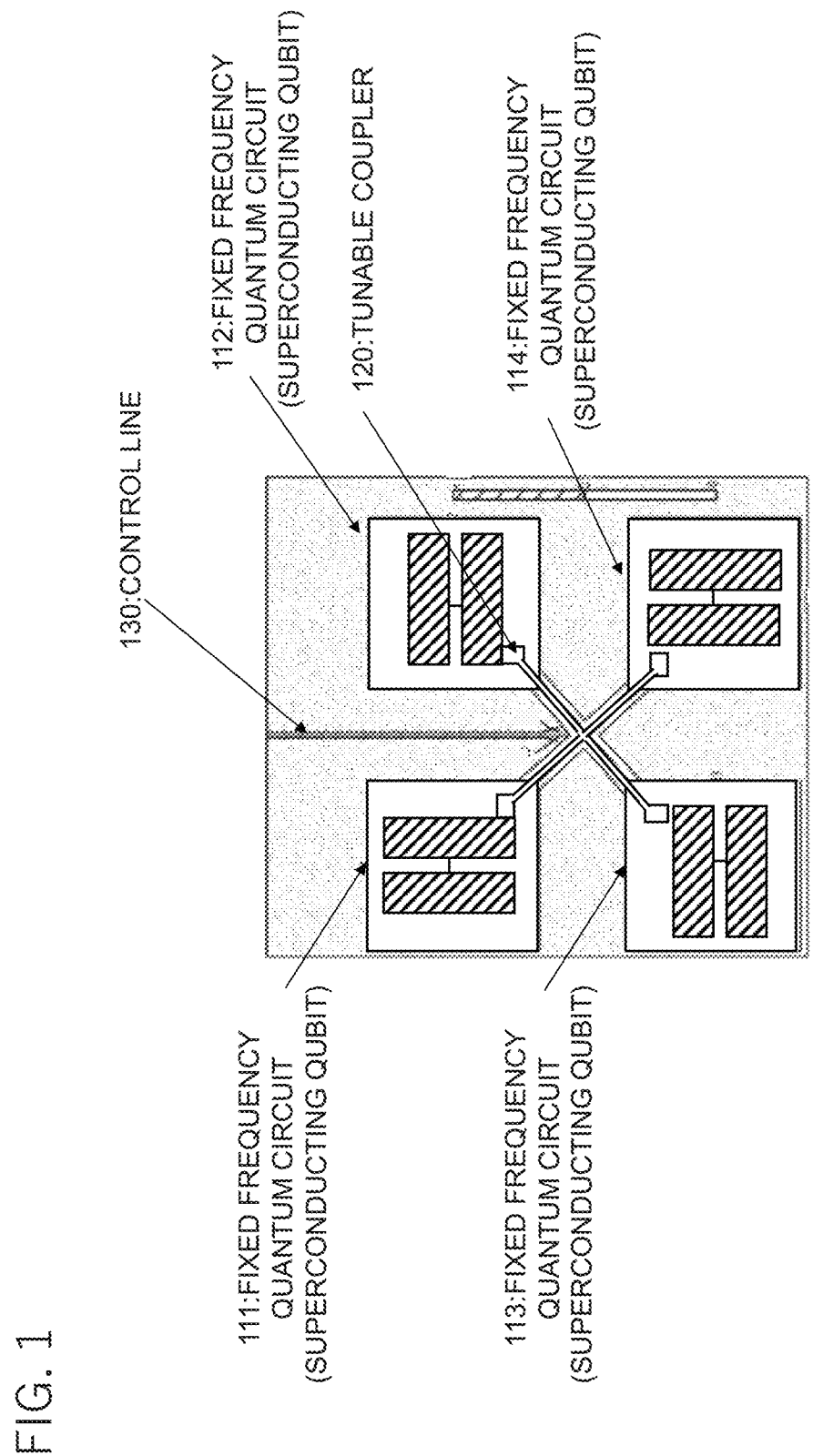
FIG. 1 is a diagram illustrating an example of a related art.

Example embodiments of the present disclosure will be described. According to one example embodiment of the present disclosure, a four-body interaction coupler includes first and second electrodes (16, 18). The first and second electrodes (16, 18), as a planer circuit configuration, are spaced apart from a planer ground pattern (ground plane) (40) disposed at surrounding peripheries of the first and second electrodes (16, 18). The first and second electrodes (16, 18) are arranged opposed to each other. The first electrode (16) includes first and second opposing portions (17A, 17B). The first and second opposing portion (17A, 17B) of the first electrode (16) are extended respectively toward first and second qubits (20A, 20B) from positions other than a side of the first electrode (16) facing the second electrode (18). The second electrode (18) includes third and fourth opposing portions (19A, 19B). The third and fourth opposing portion (19A, 19B) of the second electrode (18) are extended respectively toward third and fourth qubits (20C, 20D) from positions other than a side of the second electrode (18) facing the first electrode (16). A four-body interaction coupler (21) includes a nonlinear element (10). The nonlinear element (10) includes a Josephson junction, bridged between the first electrode (16) and the second electrode (18). At least either one of a gap between the first electrode (16) and the ground plane (40) facing the first electrode (16) and a gap between the second electrode (18) and the ground plane (40) facing the second electrode (18) is configured to include a gap width having a value of at least a same extent or one severalth of a size of the first electrode (16) or the second electrode (18). A scale of the gap width and the size of the electrodes is of approximately the same order.

The first and second electrodes (16, 18) are coupled with each other via a first capacitor (15) shunt-connected to the nonlinear element (10). The first and second opposing portions (17A, 17B) of the first electrode (16) are coupled with the first and second qubits (20A, 20B) via second and third capacitors (31A, 31B), respectively. The third and fourth opposing portions (19A, 19B) of the second electrode (18) are coupled with the third and fourth qubits (20C, 20D) via fourth and fifth capacitors (31C, 31D), respectively. Peripheries of the first and second electrodes (16, 18) are surrounded by a planar ground pattern (ground plane) (40) via a gap.

In the four-body interaction coupler (21), the nonlinear element (10) includes a SQUID (superconducting quantum interference device) including a first superconducting line, a first Josephson junction, a second superconducting line and a second Josephson junction connected in a loop. The nonlinear element (10) may further include a control line to generate a magnetic flux to penetrate through the SQUID loop when a current fed to the control line.

The four-body interaction coupler (21) may have a configuration in which the ground pattern is arranged between the first and second opposing portions (17A, 17B) of the first electrode (16) and the first and second qubits (20A, 20B), the ground pattern is arranged between the third and fourth opposing portions (19A, 19B) of the second electrode (18) and the third and fourth qubits (20C, 20D). The first and second opposing portions of the first electrode (16) and the third and fourth opposing portions (19A, 19B) of the second electrode (18) are all surrounded by the ground plane (40).

Figure 2A:
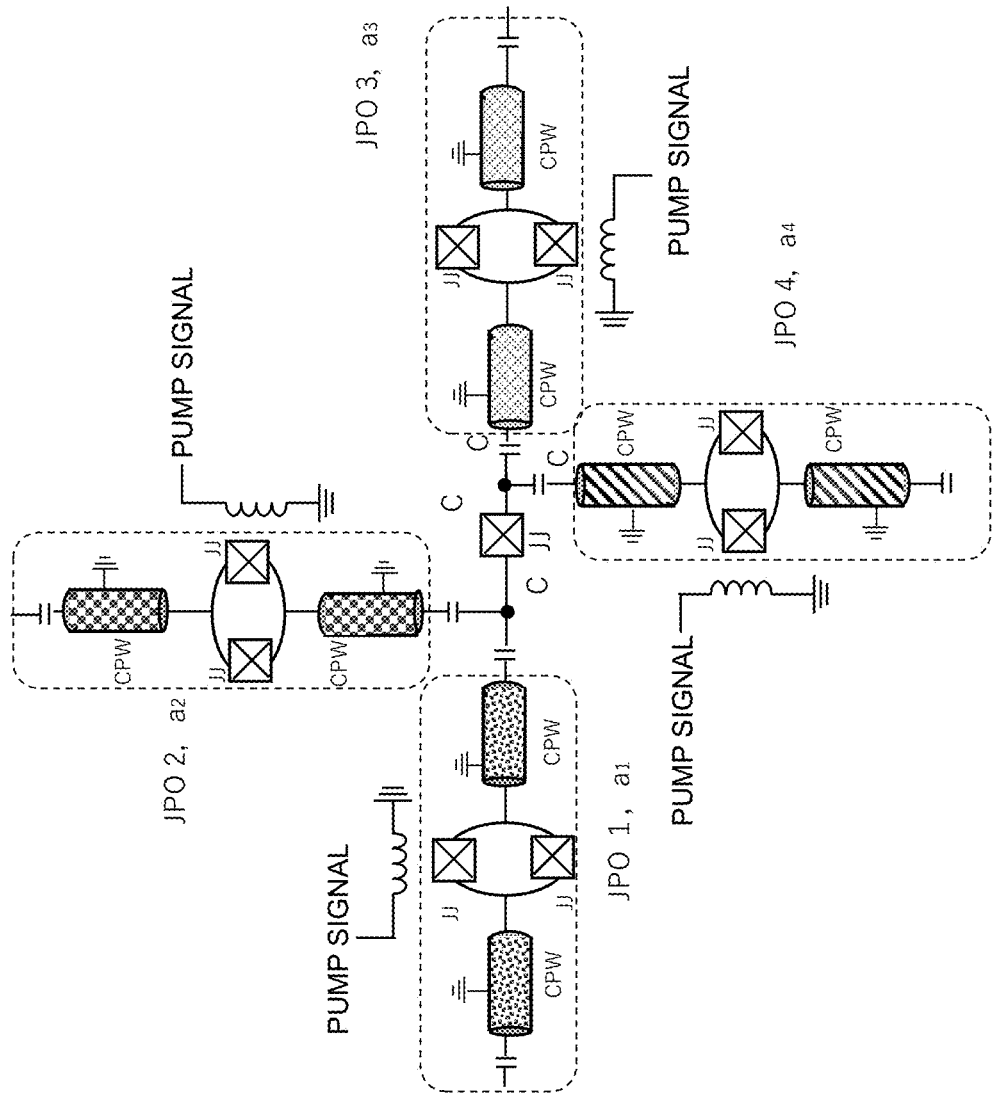
FIG. 2A is a diagram illustrating an example of a related art.
Figure 2B:
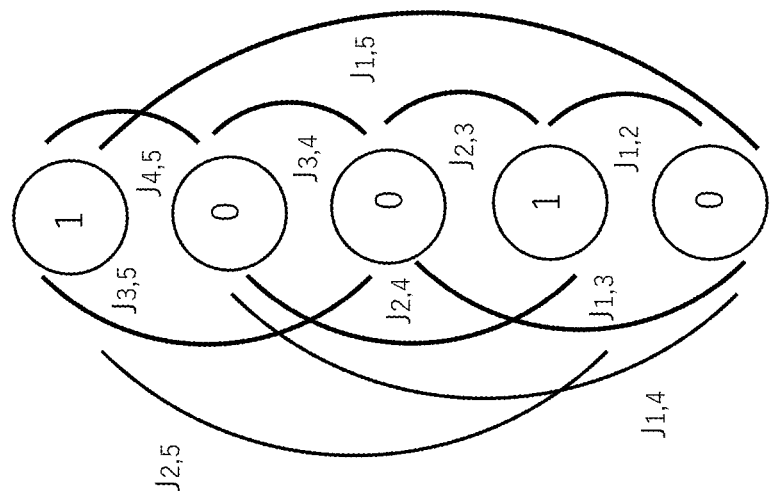
FIG. 2B is a diagram illustrating an example of a related art.
Figure 2C:
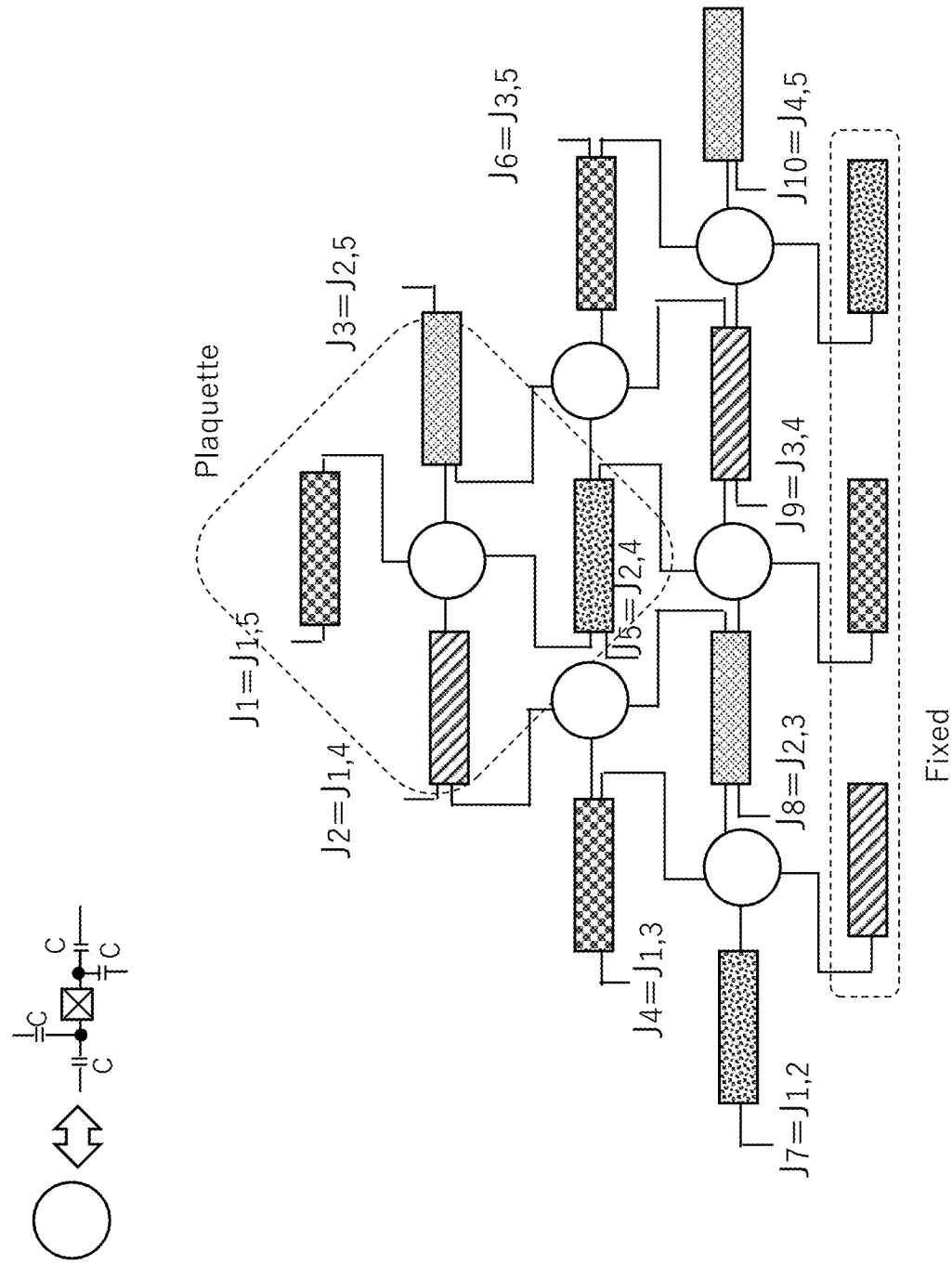
FIG. 2C is a diagram illustrating an example of a related art.

In NPL 1 described with reference to FIGS. 2A through 2C, the four-body interaction coupler includes a single Josephson junction. Therefore, the four-body interaction coupler may be sensitive to a disturbance such as a charge noise, as it is. On the other hand, a resonant frequency tunable coupler such as the one described in PTL 1 as described with reference to FIG. 1 can also operate as a four-body interaction coupler by setting the number of qubits connected by two-body interaction to four. However, with the geometry of PTL 1, there may be a decrease in a strength of the four-body interaction (coupling strength) due to floating capacitance relative to the ground, when an annealing operation, which is not contemplated in PTL 1, is to be performed. The decrease in the four-body interaction strength is a problem for the annealing operation. The present disclosure provides a four-body interaction coupler enabled to solve the above-described issues and able to be used in practical application.

The four-body interaction coupler (21) according to the present example embodiment includes lines (wirings) composed by a superconducting material formed on a substrate. Silicon substrate is used, but electronic materials such as sapphire or compound semiconductor materials (group IV, group III-V and group II-VI) may be used. The substrate is preferably of single crystal but may be polycrystalline or amorphous. As a material of the line (wiring), Nb (niobium) or Al (aluminum) may be used, for example, though not limited thereto. Any metal that becomes superconductive at a cryogenic temperature may be used, such as niobium nitride, indium (In), lead (Pb), tin (Sn), rhenium (Re), palladium (Pd), titanium (Ti), molybdenum (Mo), tantalum (Ta), tantalum nitride, and an alloy containing at least one of the above metals. In order to achieve superconductivity, the resonator circuit is used in a temperature environment of about 10 mK (millikelvin) achieved by a refrigerator.

Example Embodiment

Figure 3:
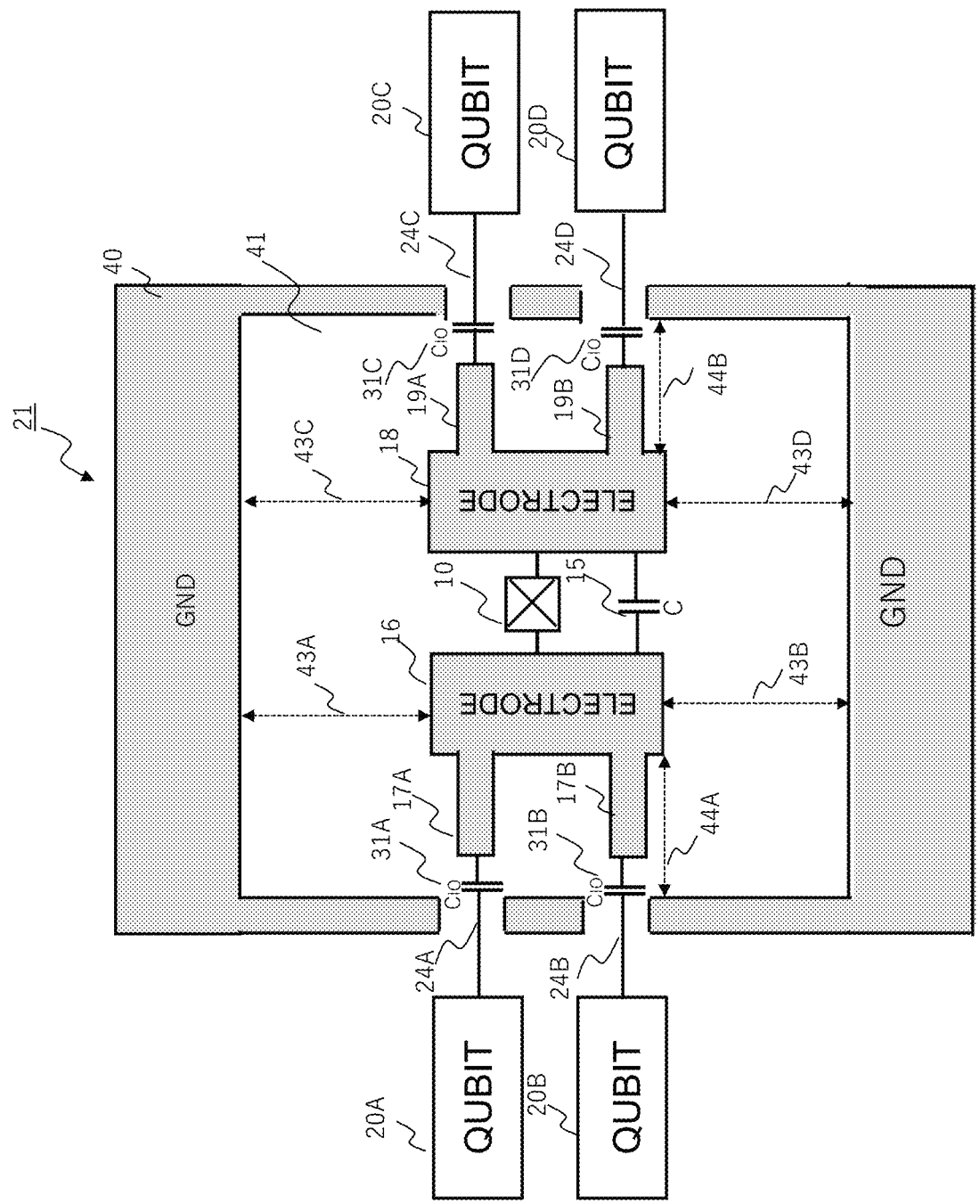
FIG. 3 is a diagram illustrating an example embodiment.

FIG. 3 is a schematic plan view illustrating an example of a configuration of an example embodiment. In FIG. 3, an example of a plane circuit (wiring pattern) of a four-body interaction coupler 21, is schematically illustrated as a part of a wiring layer with a coplanar configuration formed on a silicon substrate. In FIG. 3, a gap 41 (pattern shown in white) between a ground (GND) plane 40 and electrodes 16 and 18 each formed on the same wiring layer on the substrate, represent a region where there is no wiring pattern, and a surface of the substrate is exposed. Both electrodes 16 and 18 are spaced apart (isolated) from the GND plane 40 that surrounds peripheries of electrodes 16 and 18. Therefore, electrodes 16 and 18 may be referred to as island-shaped electrodes or isolated electrodes.

Referring to FIG. 3, in the four-body interaction coupler 21, the electrode 16 includes opposing portions 17A and 17B. The opposing portions 17A and 17B are extended (elongated) from the electrode 16 toward two qubits 20A and 20B, respectively, and are capacitively coupled (AC (Alternate Current) coupled) with qubits 20A and 20B via capacitors (coupling capacitors) (CIO) 31A and 31B, respectively. The electrode 18 facing the electrode 16, includes opposing portions 19A and 19B. The opposing portions 19A and 19B are extended (elongated) from the electrode 18 toward two qubits 20C and 20D, respectively, and are capacitively coupled (AC coupled) with qubits 20C and 20D via capacitors (coupling capacitors) (CIO) 31C and 31D, respectively. A coupling capacitor is a capacitor to couple together only an AC signal from one circuit element to another. The electrode 16 and the electrode 18 are bridged by a nonlinear element 10 including a Josephson junction.

The Josephson junction included in the nonlinear element 10 may be a single Josephson junction or a SQUID which has a loop with two Josephson junctions. The qubits 20A, 20B, 20C, and 20D may be configured with a lumped element type JPO.

Capacitors (CIO) 31A and 31B are disposed between the opposing portions 17A and 17B extending from the electrode 16 and connection portions (coupler connection portions) 24A and 24B of the qubits 20A and 20B for connecting to the coupler 21, respectively. Capacitors (CIO) 31C and 31D are disposed between the opposing portions 19A and 19B extending from the electrode 18 and connection portions (coupler connection portions) 24C and 24D of the qubits 20C and 20D for connecting to the coupler 21. The capacitors (31A, 31B) and (31C, 31D), each illustrated as a capacitor symbol, represent a static capacitance (also called a floating capacitance) between the opposing portions (17A, 17B) and (19A, 19B) and the connection portions (24A, 24B) and (24C, 25D) for correspondence with FIG. 4 below. Only a gap is present between the opposing portions 17A and 17B and the connection portions 24A and 24B opposed thereto and only a gap is present between the opposing portions 19A and 19B and the connection portions 24C and 24D opposed thereto.

The electrodes 16 and 18 are capacitively coupled via a capacitor (C) 15 disposed therebetween. The capacitor (C) 15 disposed between the electrodes 16 and 18 illustrated as a capacitor symbol for correspondence with FIG. 4 below represents a static capacitance (floating capacitance) between the electrodes 16 and 18. In fact, there is only a gap present between the electrodes 16 and 18.

In the example illustrated in FIG. 3, only for simplicity's sake, the opposing portions 17A and 17B, and the opposing portion 19A and 19B are extended from one side of a rectangular shape of electrodes 16 and 18, respectively. But the planar shape of the electrodes 16 and 18 is, as a matter of course, not limited to a rectangular shape. The opposing portions 17A and 17B and the opposing portions 19A and 19B are extended parallel to each other, respectively. But the opposing portions 17A and 17B and the opposing portions 19A and 19B may be configured to be extended perpendicularly to each other, as from a top edge (or bottom edge) and a side edge of the electrodes 16 and 18, depending on an arrangement of the qubits. The opposing portions 17A and 17B and the opposing portions 19A and 19B are rectangular in shape with the same width in a longitudinal direction. But the planar shape of the opposing portions 17A and 17B and the opposing portions 19A and 19B is, as a matter of course, not limited to a rectangular shape.

According to the configuration illustrated in FIG. 3, the electrode 16 and the ground (GND) plane 40 facing the electrode 16 are separated by a large gap, and the electrode 18 and the ground (GND) plane 40 facing the electrode 18 are separated by a large gap, thereby reducing a floating capacitance between the ground (GND) and each of the electrodes 16 and 18.

When a gap width between each of the electrodes 16 and 18 and the ground (GND) plane 40 is set to be too large, each length of the opposing portions 17A and 17B extending from the electrode 16 and each length of the opposing portions 19A and 19B extending from the electrode 18 are increased. If the length is not sufficiently shorter than a signal wavelength, a microwave phase rotation in the opposing portions through which the microwave propagates, becomes not negligible, and the four-body interaction coupler 21 cannot be treated as a lumped element circuit.

In FIG. 3, each of gap widths 43A and 43C between each of top side of the electrodes 16 and 18 and the GND plane 40 facing thereto and each of gap widths 43B and 43D between each of bottom sides of the electrodes 16 and 18 and the GND plane 40 facing thereto may generally be of a size almost the same as or one severalth of that of the electrodes 16 and 18. In the example in FIG. 3, each gap width 43A to 43D is of a size comparable to a height of the electrodes 16 and 18, i.e., the same as or slightly larger than the height, or one severalth of the height. Also, a gap width 44A between a side of a rectangular part of the electrode 16 and the GND plane 40 facing thereto and a gap width 44B between a side of a rectangular part of the electrode 18 and the GND plane 40 facing thereto may be of a size comparable to the size of the electrodes 16 and 18. For example, each gap width 44A and 44B is of a size comparable to the height of the electrodes 16 and 18. However, if the size of the electrodes 16 and 18 is even smaller, a ratio between the size of the electrodes 16 and 18 and the gap width between each of the electrodes 16 and 18 and the GND plane 40 changes. The gap widths 43A and 43C, and the gap widths 43B and 43D may be set to equal values. Only for the sake of simplicity of the drawing, the gap widths 44A and 44B are illustrated smaller than the gap widths 43A and 43B in FIG. 3. In some point or region other than opposing portions (17A, 17B, 19A, and 19B), a gap between the electrodes 16 and 18 and the ground plane 40 may have a gap width less than the same as or one severalth of that of the electrodes 16 and 18.

As a non-limiting example, the gap widths 43A-43D, 44A and 44B may be about 100 μm, for example. However, the gap width may be set to a value greater than 100 μm. In this case, an upper limit of the gap width may be set to a value in a range in which a lumped element circuit can be applied, e.g., on an order of a few to ten and several percent of a signal wavelength (a quarter wavelength or less). In other words, the gap widths 44A and 44B may be set to a value such that a length of the opposing portions 17A and 17B and the opposing portions 19A and 19B are about a few percent of the wavelength or less. If the signal frequency is 10 GHz (Gigahertz), the signal wavelength is given by $$c/\sqrt{\epsilon_r \times \mu_r}/1\ \text{GHz} = (3 \times 10^8 [m/s])/\{(\sqrt{\epsilon_r} \times 10^{10} [/s])\}$$

where εr is a relative permittivity of a medium and γr is the relative permeability of the medium. For a silicon substrate, εr=11.9 and μr=1, so the signal wavelength is 3 cm (centimeter)/√11.9=0.87 cm. In this case, assuming that the length of each of the opposing portions 17A and 17B and the opposing portions 19A and 19B is, for example, 2% of the signal wavelength, the length thereof is about 17.4 mm (millimeter) and the gap widths 44A and 44B are approximately 18 mm (It is as a matter of course that the gap widths 44A and 44B are less than this). Assuming that the size of each of the electrodes 16 and 18 is about 100 μm, the upper limit of the gap widths (about 18 mm) is by an order of magnitude (10 to the second power) larger than the size of the electrodes 16 and 18.

Figure 4:
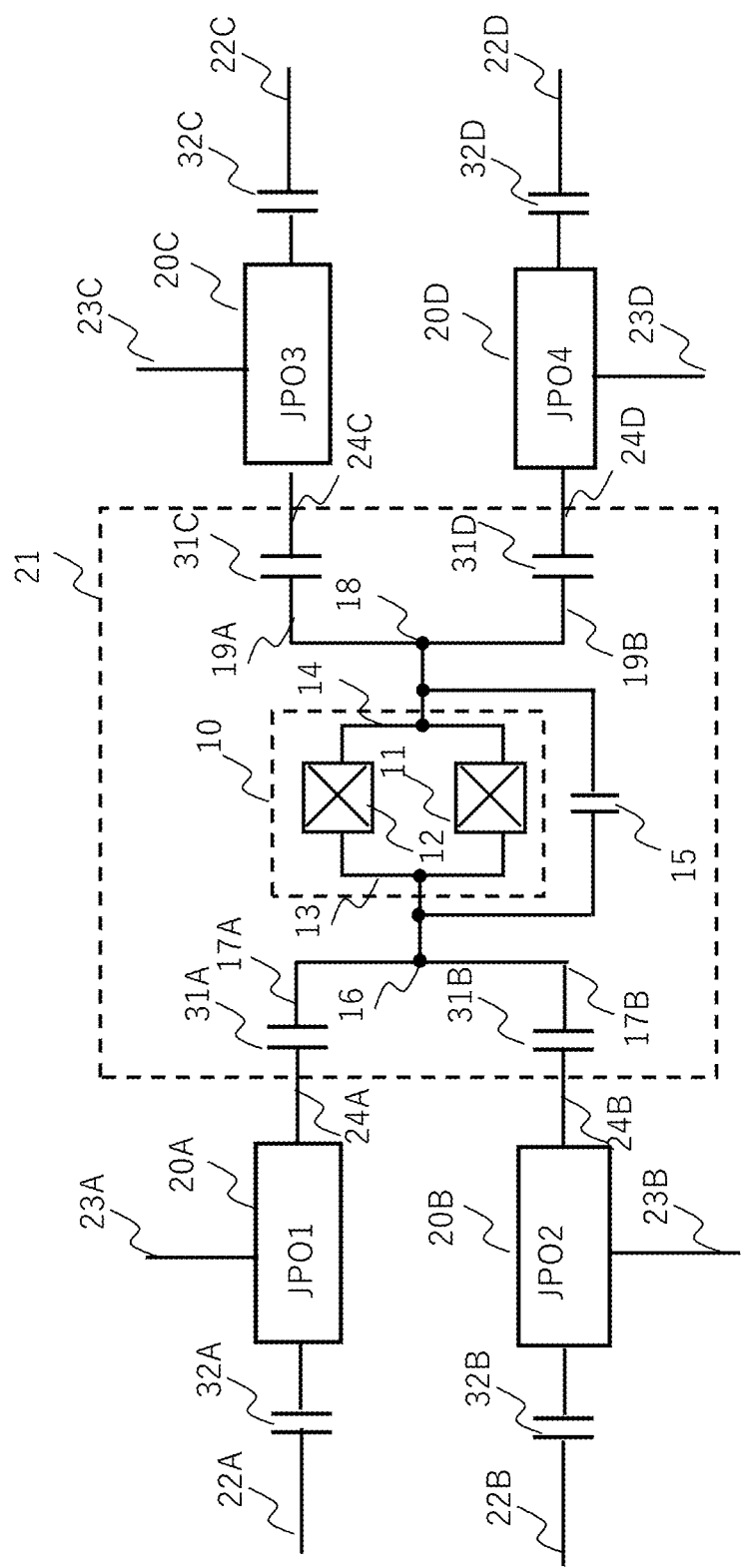
FIG. 4 is a diagram illustrating an example embodiment.

FIG. 4 schematically illustrates a configuration of a circuit of a superconducting quantum circuit including the four-body interaction coupler 21 illustrated in FIG. 3. In FIG. 4, the qubits illustrated in FIG. 3 are configured using a lumped element type JPO. Referring to FIG. 4, a nonlinear element 10 includes a SQUID in which a first superconducting line 13, a first Josephson junction 11, a second superconducting line 14, and a second Josephson junction 12 are connected in a loop. The electrodes 16 and 18 are illustrated as nodes 16 and 18. A capacitance (C) 15 is connected in parallel with nonlinear element 10 (shunt connection) between nodes 16 and 18. The opposing portions 17A and 17B, and the opposing portions 19A and 19B in FIG. 3 are respectively illustrated as two branches from nodes 16 and 18. JPOs 20A, 20B, 20C, and 20D are connected to respective connection portions 22A, 22B, 22C, and 22D which connect with readout circuits via capacitors (input/output capacitors) 32A, 32B, 32C, and 32D, respectively. The connection portions 24A, 24B, 24C, and 24D of the JPO 20A, 20B, 20C, and 20D for connecting to the coupler are connected to the opposing portions 17A and 17B of electrode 16 and the opposing portions 19A and 19B of electrode 18 via the coupling capacitors 31A, 31B, 31C, and 31D. Reference numerals 23A, 23B, 23C, and 23D designate respectively connection portions for connecting to a current control part (not shown) that supplies a current to each control line to generate a magnetic flux penetrating through each SQUID loop of the JPOs 20A, 20B, 20C, and 20D.

Figure 5A:
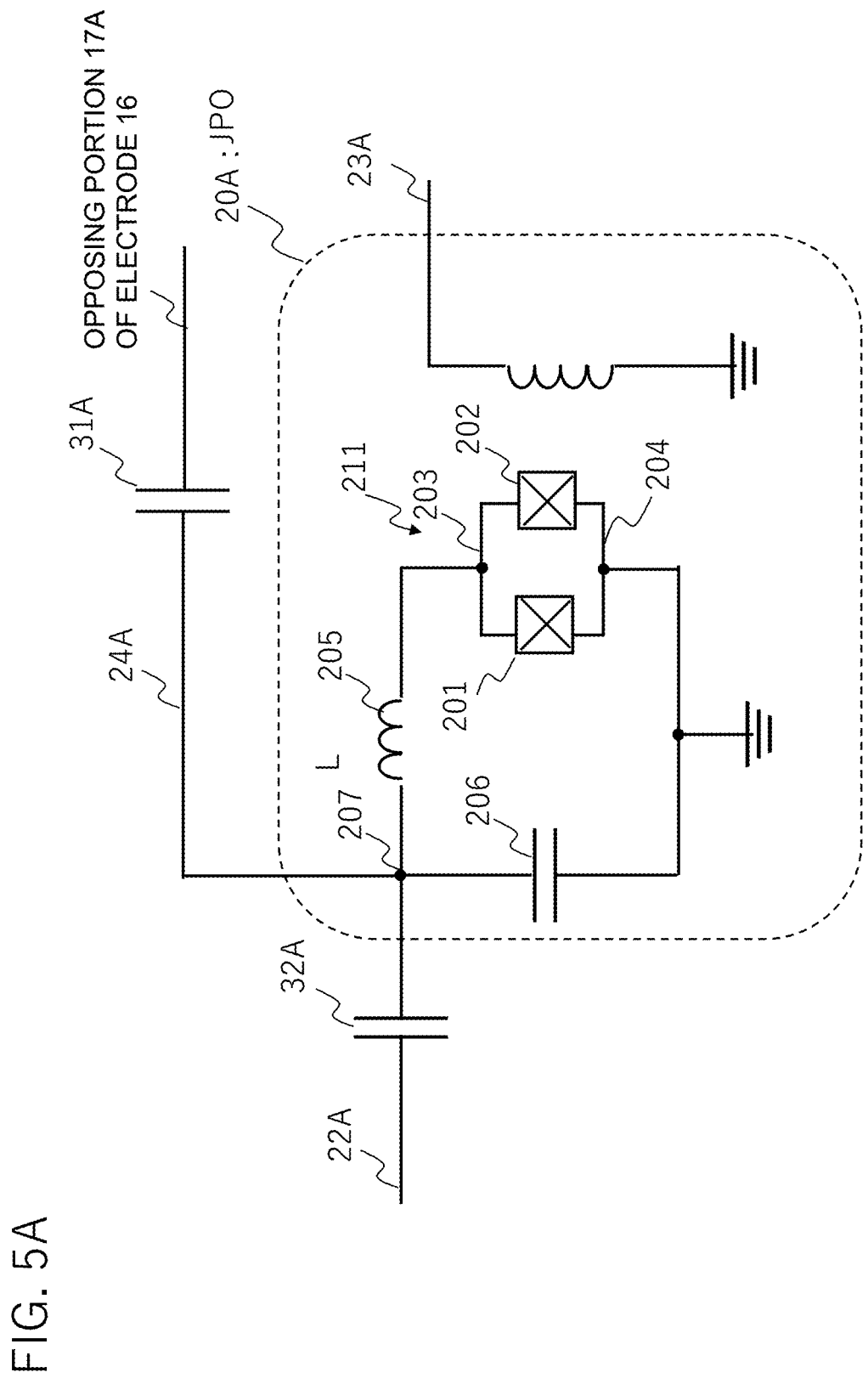
FIG. 5A is a diagram illustrating an example embodiment.

FIG. 5A illustrates an example of a lumped element type JPO, as the JPO 20 in FIG. 4. Since JPOs 20A-20D in FIG. 4 are configured identically, a configuration of JPO 20A is illustrated in FIG. 5A. Referring to FIG. 5A, JPO 20A includes a SQUID 211 in which a first superconducting line 203, a first Josephson junction 201, a second superconducting line 204, and a second Josephson junction 202 are connected in a loop. The second superconducting line 204 is connected to the ground and the first superconducting line 203 is connected to a superconducting portion (electrode) indicated by a node 207. An inductance 205 disposed between the node 207 and the first superconducting line 203 mainly represents an inductance component L of the superconducting portion (electrode). Since the inductance 205 is smaller than an inductance (self-inductance) of the SQUID 211, it may be omitted in a circuit diagram. A capacitor 206 disposed between the node 207 and ground represents a capacitance (capacitance component) between the superconducting portion (electrode) and ground. The capacitor 206 constitutes a parallel LC resonant circuit together with the self-inductance of the SQUID 211, etc. Current for generating a magnetic flux (magnetic field) penetrating through the loop of the SQUID 211 is supplied to the control line 23A from a control part (not shown). Current (pump signal) is supplied to the control line 23A from the control part (not shown). The node 207 is connected to the connection portion (coupling portion) 22A for connecting to the readout circuit (not shown) via the capacitor 32A. A line 24A from the node 207 is connected, for example, to the opposing portion 17A of the electrode 16 of the coupler via the capacitor 31A.

Figure 5B:
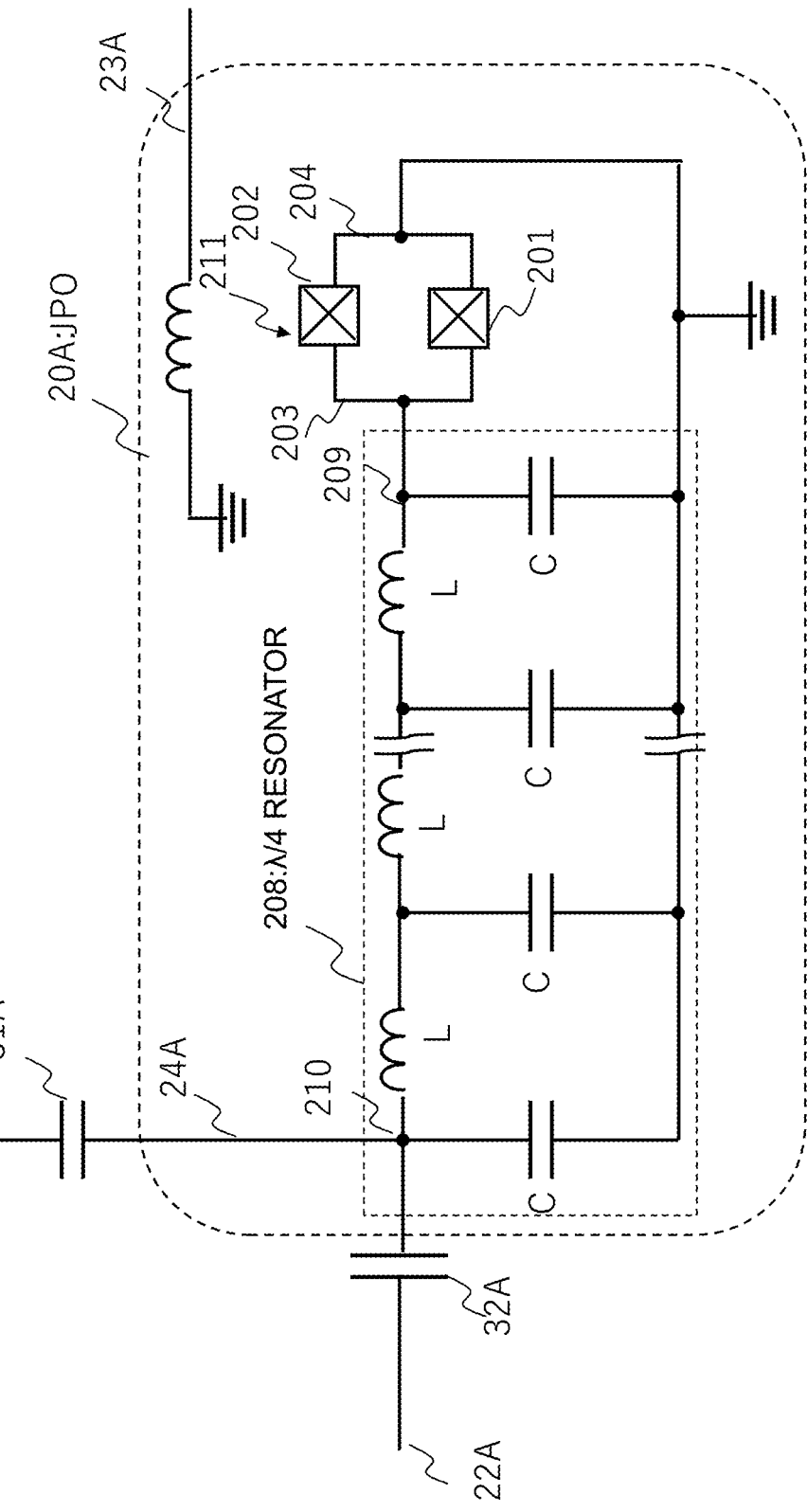
FIG. 5B is a diagram illustrating an example embodiment.

FIG. 5B illustrates an example of a distributed element type JPO, as the JPO 20 in FIG. 4. In FIG. 5B, a quarter-wavelength (λ/4) resonator 208 is illustrated as a distributed element circuit with multistage cascaded connection of four-terminal circuits, each having an inductance L and a capacitance C. A first superconducting line 203 of the SQUID 211 is connected to a node 209, which is one end of the λ/4 resonator 208. A node 210, which is the other end of the λ/4 resonator 208, is connected, via the capacitor 32A, to a connection portion (coupling portion) 22A for connecting to a readout circuit (not shown).

A line 24A from the node 210 is connected, via the capacitor 31A, for example, to the opposing portion 17A of the electrode 16 of the coupler.

Example 1

Figure 6A:
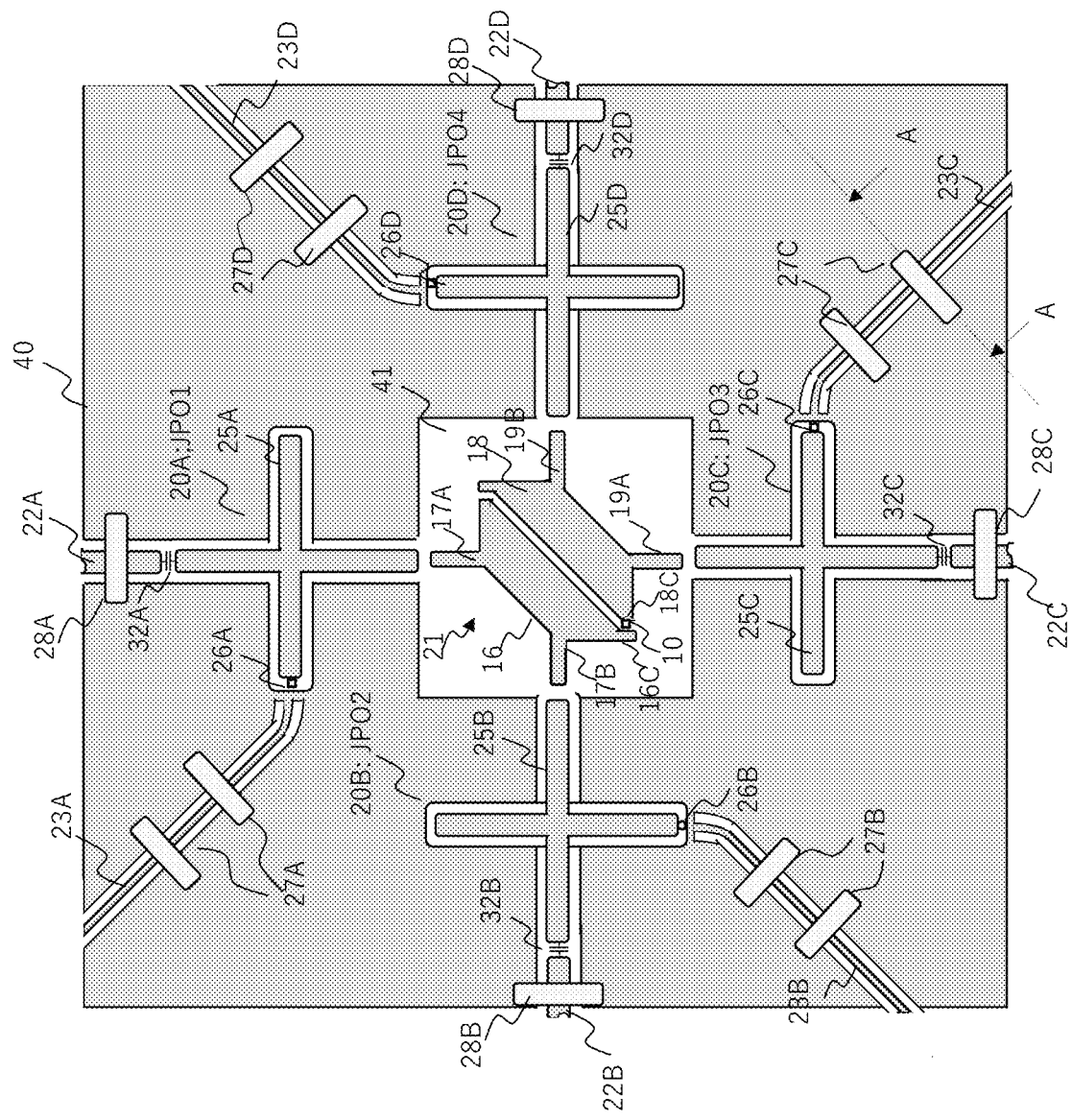
FIG. 6A is a diagram illustrating an example embodiment.

FIG. 6A illustrates one example of the above-described example embodiment. In FIG. 6A, a planar configuration in which four lumped element type JPOs 20A to 20D are connected to the four-body interaction coupler 21 is illustrated. The four-body interaction coupler 21 is configured by a resonator including a nonlinear element that includes a linear (not nonlinear) inductance, a capacitance component and a Josephson junction.

A planar shape of the electrode 16 is trapezoidal and is a shape with rotated about 45 degrees counterclockwise. The opposing portion 17A and 17B of the electrode 16 are extended (elongated), respectively, from vicinities of intersections between an upper side and oblique sides (legs) of the trapezoid toward a top and left sides in the drawing, i.e., toward locations where JPOs 20A and 20B are arranged.

A planar shape of the electrode 18 is an inverted trapezoidal shape with the trapezoid rotated clockwise by approximately 135 degrees. The opposing portions 19A and 19B of the electrode 18 are extended (elongated), respectively, from vicinities of intersections of an upper side and oblique sides (legs) of the trapezoid toward a bottom side and a right side in the drawing, i.e., toward locations where JPOs 20C and 20D are arranged.

The electrodes 16 and 18 are arranged with respective bottom sides of the trapezoids facing each other, and a planar shape of electrodes 16 and 18 when aligned with all opposing portions excluded, is nearly hexagonal.

The electrode 16 has a protrusion 16C protruding downward in the drawing in a vicinity of an intersection of one end of a lower base and the oblique side of the electrode 16. The electrode 18 has a cut portion 18C cut off the electrode 18 extending parallel to the protrusion of the electrode 16 in a vicinity of an intersection of one end of the lower base and the oblique side of the electrode 18. A nonlinear element 10, such as the SQUID, is arranged in a gap between the projection 16C, which is located in a vicinity of an intersection of one end of the lower base and the oblique side of the electrode 16, and the cut part 18C, which is located in a vicinity of an intersection of one end of the lower base and the oblique side of the electrode 18. The diagonally arranged configuration of the electrodes 16 and 18 in the coupler 21 enables to make a placement area of the coupler 21 compact.

JPOs 20A, 20B, 20C, and 20D include coplanar waveguides (Coplanar Waveguides) 25A, 25B, 25C and 25D and SQUIDs 26A, 26B, 26C, and 26D, respectively, where LC resonant circuits in a microwave region are composed by linear inductance components and capacitance components of the coplanar waveguides 25A, 25B, 25C and 25D and nonlinear inductance components of SQUIDs 26A, 26B, 26C, and 26D, respectively. By supplying a DC current to each of control lines 23A, 23B, 23C, and 23D inductively coupled with SQUIDs 26A, 26B, 26C, and 26D, a resonant frequency of each of JPOs 20A, 20B, 20C, and 20D is enabled to be adjusted. By supplying an AC current with a frequency almost twice a resonant frequency of each JPO to each of control lines 23A, 23B, 23C, and 23D, a parametric oscillation of each of JPOs 20A, 20B, 20C, and 20D is enabled to be induced.

Connection portions (waveguides for I/O) 22A, 22B, 22C and 22D for connecting to readout circuits (not shown) are capacitively coupled via capacitors 32A, 32B, 32C and 32D with the JPO 20A, 20B, 20C, and 20D, respectively. In FIG. 6A, the capacitor 15 and capacitors (coupling capacitors) (CIO) 31A, 31B, 31C, and 31D in FIG. 4 are omitted. The connection portions (coplanar waveguides for I/O) 22A, 22B, 22C, and 22D for connecting to the readout circuits, respectively, are shown in part. Each line of the connection portions (coplanar waveguides for I/O) 22A-22D has a configuration extended to a chip periphery, for example, is connected to a wiring layer of an interposer substrate (a wiring substrate that provides electrical connection between circuits of front and back wiring layers by a through via hole(s)), and are further connected to a circulator (not shown) and a readout circuit outside a refrigerator (not shown) with a readout line (cable).

The superconducting quantum circuit includes air bridge wirings (air bridges) 27A, 27B, 27C, and 27D with respect to the control lines 23A, 23B, 23C, and 23D with the coplanar waveguide configuration. The air bridges 27A, 27B, 27C, and 27D are overhead wiring over the wiring layer to stabilize ground potential surrounding the JPOs 20A, 20B, 20C, and 20D. The control lines 23A, 23B, 23C, and 23D have configurations that are connected to a wiring layer of the interposer substrate (not shown) via bump electrodes (not shown) or the like at a periphery of a chip, for example, and are connected to a microwave signal generation circuit or the like outside a refrigerator (not shown).

Figure 6B:
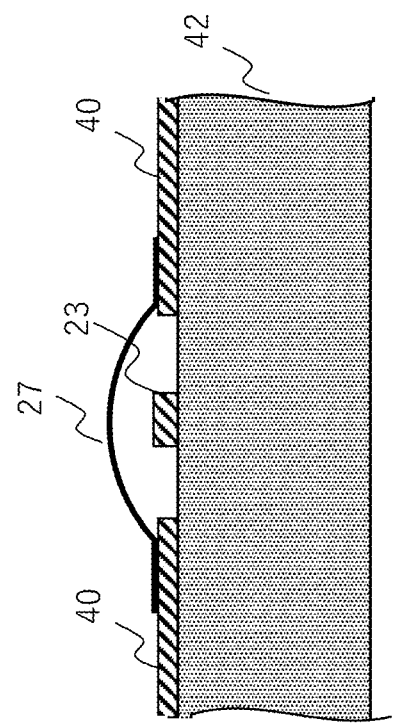
FIG. 6B is a diagram illustrating an example embodiment.

FIG. 6B schematically illustrates a cross section of an A-A line orthogonal to the control line 23C in the planar structure illustrated in FIG. 6A. The cross section for control lines 23A-23D is also configured identically, therefore, in FIG. 6B, the control line 23C and the air bridge wiring 27C are indicated by the signs 23 and 27. For example, a wiring layer is formed on a surface of a substrate 42 of silicon, on which the JPO 20 (20A-20D) and the coupler (21) are formed. The control line 23 is configured in the same wiring layer as this wiring layer by a coplanar waveguide. As illustrated in FIG. 6B, GND patterns 40 are provided on both sides of the control line 23 (wiring) in a longitudinal direction, via a gap. Air bridge wiring 27 is formed in such a manner that strides over the control line 23 in an arch shape and connects the GND patterns 40 on both sides. An air bridge wiring structure with respect to the GND plane 40 prevents the GND plane 40 from being divided into both sides by the control line 23 (23A-23D) configured with the coplanar waveguide. This results in a stabilization of a ground potential that surrounds JPOs 20A, 20B, 20C, and 20D. As a non-limiting example, In FIG. 6A, connection portions (coplanar waveguides for I/O) 22A, 22B, 22C and 22D for connecting to readout circuits (not shown) are provided with air bridge wirings 28A, 28B, 28C, and 28D, which are made an overhead wiring over the wiring layer, respectively, as well as the control lines 23A-23D. Air bridge wirings 28A-28D of the connection portions (coplanar waveguides for I/O) 22A-22D, also have the same cross-section configuration as illustrated in FIG. 6B.

In FIG. 6A, JPOs 20A-20D are configured as lumped element type circuits, but JPOs 20A-20D may be configured as distributed element type circuits, as illustrated in FIG. 5B.

As described above, the four-body interaction coupler 21 is a lumped element type LC resonant circuit similar to JPO 20, where the coupler 21 includes two ungrounded electrodes 16 and 18 (island-shaped electrode) and a nonlinear element 10 bridging electrodes 16 and 18.

A strength of a four-body interaction depends on detuning of a resonance frequency between the four-body interaction coupler 21 and the JPO 20. Therefore, as for the superconducting quantum circuit according to this example embodiment, the coupling strength can be controlled in situ by adjusting the resonance frequency of the JPO 20 and/or the four-body interaction coupler 21.

The two electrodes 16 and 18 of the four-body interaction coupler 21 are coupled via the capacitor 15. In addition, the electrode 16 and the electrode 18 are coupled with two JPOs 20A and 20B and with two JPOs 20C and 20D via capacitors 31A and 31B and via capacitors 31C and 31D, respectively, and have structures that are entirely enclosed by the ground. The opposing portions 17A and 17B and the opposing portions 19A and 19B capacitively coupled with the JPOs 20A and 20B and JPOs 20C and 20D, respectively, protrude from the electrode 16 and the electrode 18 respectively toward the GND plane 40 facing the opposing portions and can be coupled to each of JPOs 20A and 20B, and JPOs 20C and 20D at a point away from each of the electrode 16 and the electrode 18.

According to the configuration of the present example embodiment, a large gap, with no superconductor deposited, is provided for separation between the GND plane 40 and a part of each of the electrodes 16 and 18 other than coupling capacitors 31A-31D, for example, by an order of about 100 μm (micrometer) in length, thus reducing a floating capacitance between the ground (GND) pattern 40 and each of the electrodes 16 and 18. The gap is of a size comparable to the four-body interaction coupler 21.

The capacitor 15 between the electrodes 16 and 18 makes the four-body interaction coupler 21 robust against a disturbance(s) caused by a magnetic field noise, etc.

The reduction of a floating capacitance of the four-body interaction coupler 21 to the ground has an effect of strengthening four-body interaction. Regarding the coupling strength due to the four-body interaction coupler 21 which is capacitively coupled with the resonators (JPOs), the floating capacitance of the four-body interaction coupler 21 to the ground will reduce a contribution ratio of a capacitance that contributes to the coupling relative to the total capacitance obtained by adding a floating capacitance to the ground and a coupling capacitance of the resonator to a self-capacitance (capacitance 15) of the four-body interaction coupler 21. Thus. the floating capacitance generally weakens the coupling strength of the four-body interaction coupler 21 capacitively coupling with the resonators (JPOs).

In a space due to formation of a large gap, a portion of the JPO 20 can be provided and the opposing portions 17A and 17B and the opposing portions 19A and 19B can be arranged, which makes it possible to realize an efficient utilization of a planar circuit.

As described above, the four-body interaction coupler 21 of the example embodiment includes the two ungrounded electrodes 16 and 18 and the nonlinear element 10 which includes Josephson junctions and bridges the electrodes 16 and 18.

The electrodes 16 and 18 are capacitively coupled and electrode 16 (18) includes the opposing portions 17A and 17B (19A and 19B) capacitively coupled with the two JPOs 20A and 20B (20C and 20D). The opposing portions 17A and 17B (19A and 19B) protrude from electrodes 16 (18) toward the opposite side facing the electrode 16 (18). A large gap widths 43A and 43B (43C and 43D), and 44A (44B) separate between the GND plane 40 and the electrode 16 (18) other than opposing portions 17A and 17B (19A and 19B), thereby reducing a floating capacitance of the electrode 16 (18).

In the example embodiment, in FIG. 6A, the nonlinear element 10 in the coupler 21 may be constituted by a SQUID. Control lines (coplanar waveguide) may be provided to which a current is supplied to apply a magnetic flux to the SQUID of the JPOs 20 and the coupler 21 from a direction perpendicular to the plane.

When the magnetic flux is to be applied from the control line arranged perpendicular to the plane, an additional planar circuit (interposer substrate; not shown) may be provided parallel to the plane in which the JPOs 20 and the coupler 21 are arranged, and a current may be fed through the control line provided on the additional planar circuit (opposing planar circuit) for applying a magnetic flux.

Variation Example

Figure 7:
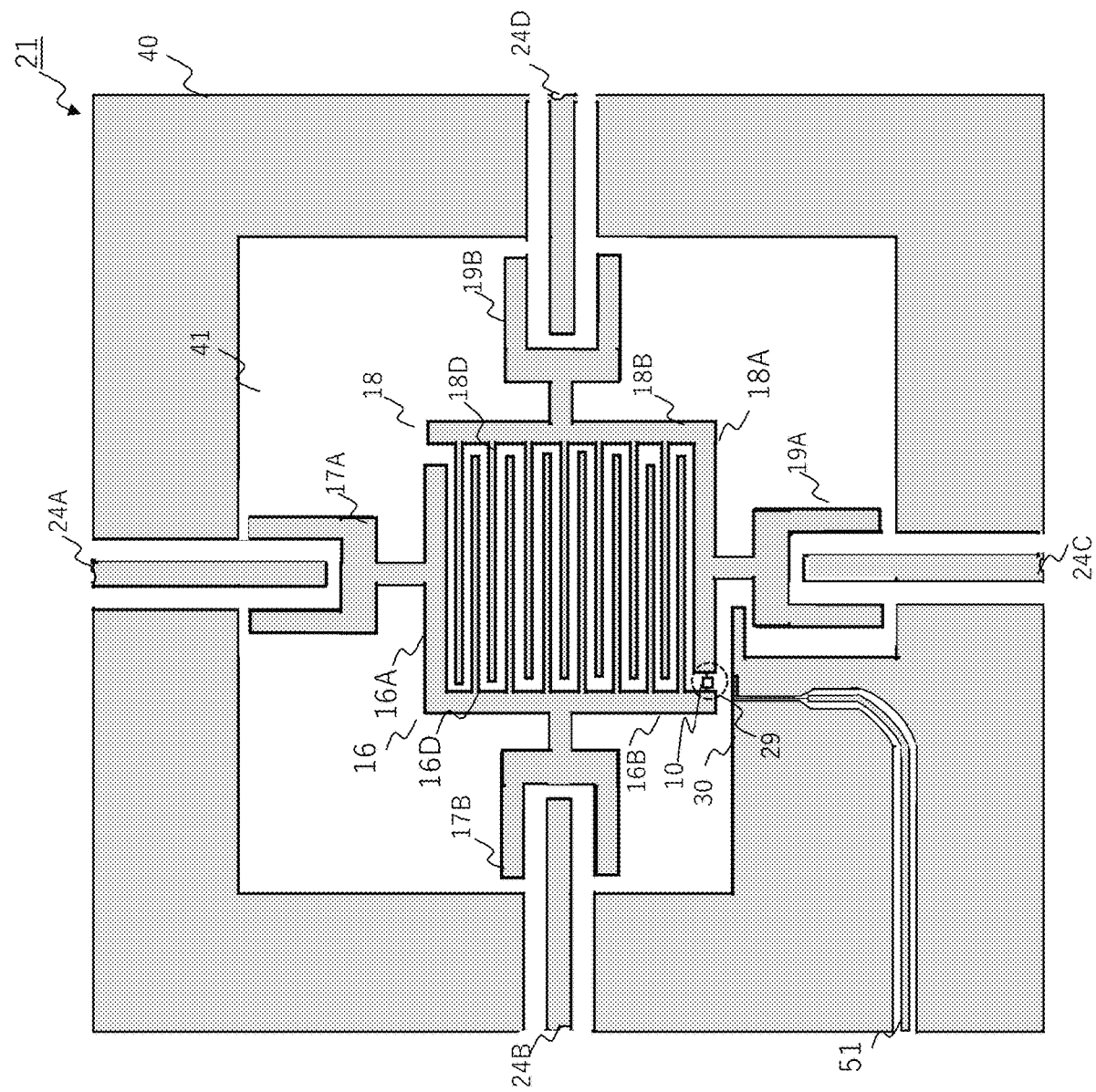
FIG. 7 is a diagram illustrating an example embodiment.

FIG. 7 is a diagram illustrating a four-body interaction coupler 21 according to a variation example. In FIG. 7, a planer circuit corresponding to the four-body interaction coupler 21 illustrated in FIG. 4 is illustrated while qubits (JPO) 20A-20B are not shown. Referring to FIG. 7, the four-body interaction coupler 21 of the present variation example, includes an electrode 16 configured with right-angle bent sides (lateral member 16A, longitudinal (vertical) member 16B), and an electrode 18 configured with right-angle (L-shaped) bent sides (lateral member 18A and longitudinal (vertical) member 18B). The longitudinal members 16B and 18B of the electrodes 16 and 18 are disposed opposed to each other, and the lateral members 16A and 18A are also disposed opposed to each other. The electrode 16 includes n (seven in FIG. 7) extension portions 16D extending at a predetermined interval parallel to the lateral member 16A from the longitudinal member 16B to the longitudinal member 18B of the electrode 18 to have a comb-teeth pattern shape. The electrode 18 also includes n extension portions 18D extending at a predetermined interval parallel to the lateral member 18A from the longitudinal member 18B to the longitudinal member 16B of the electrode 16 to have a comb-tooth pattern shape. The extension portions 16D and 18D each corresponding to a comb-teeth are arranged facing to each other in a nested structure. Letting a capacitance between neighboring extension portions 16D and 18D, a capacitance between the lateral member 16A and the extension portion 18D opposed thereto, and a capacitance between the lateral member 18A and the extension portion 16D opposed thereto are the same value Ca, a capacitance C1 between lateral members 16A and 18A is approximated by a configuration with parallelly connected 2n+1 capacitors of a capacitance value: Ca. Thus, the capacitance C1 is given as follows.

$$C1 = (2n+1) \times Ca \quad (2)$$

Assuming that the extension portions 16D and 18D, which are arranged opposed to each other in a nested manner and each have comb-teeth shape, are not provided, a space between the lateral members 16A and 18A is (2n+1) times larger than the space between opposing extension portions 16D and 18D in FIG. 7. In this case, regarding a capacitance C2 between the lateral members 16A and 18A, the following holds.

$$C2 < Ca/(2n+1) \quad (3)$$

The capacitance C1 between the electrodes 16 and 18, each of which has a structure that are arranged comb-teeth opposed to each other in a nested manner, is, as a coarse estimate, greater than $(2n+1)^2$ times the capacitance C2 without a nested comb-teeth structure.

With the comb-shaped capacitor between the electrodes 16 and 18, a capacitance between the electrodes 16 and 18 is increased, thus further effectively reducing an impact exerted by a voltage fluctuation due to such as an electric field noise to implement a stable four-body interaction coupling.

The lateral member 16A of the electrode 16 includes an opposing portion 17A corresponding to the JPO 20A in FIG. 6A, and the longitudinal member 16B of the electrode 16 includes an opposing portion 17B corresponding to the JPO 20B in FIG. 6A. Each of the opposing portions 17A and 17B has a U-shaped expanded portion and a base portion connected to the electrode 16. In spaces of the U-shaped expanded portions of the opposing portions 17A and 17B, lines (wirings) 24A and 24B, each of which is configured as a coplanar waveguide, are formed, respectively. The lines 24A and 24B correspond to connection portions for connecting to the four-body interaction coupler 21 in the JPO 20A and 20B (the connection portions are referred to by the same reference numerals as the lines (wirings).

The lateral member 18A (bottom side) of the electrode 18 is provided with has an opposing portion 19A corresponding to the JPO 20C in FIG. 6A, and the longitudinal member 18B of the electrode 18 is provided with an opposing portion 19B corresponding to the JPO 20D in FIG. 6A. Each of the opposing portions 19A and 19B has a U-shaped expanded portion and a base portion connecting to the electrode 18. In the U-shaped expanded portions of the opposing portions 19A and 19B, coplanar waveguide type lines 24C and 24D are arranged, respectively. The lines 24C and 24D correspond to connection portions connecting with the four-body interaction coupler 21 in the JPO 20C and 20D.

A nonlinear element 10 is configured by a SQUID disposed between an end of the longitudinal member 16B of the electrode 16 and an end of the lateral member 18A of the electrode 18 to bridge the longitudinal member 16B and lateral member 18A. The SQUID includes the nonlinear element 10 which bridges the electrode 16B (an end of the longitudinal member 16B) and the electrode 18A (an end of the lateral member 18A). In FIG. 7, the electrode 16 (an end of the longitudinal member 16B) and the electrode 18 (an end of the lateral member 18A), each of which are bridged by the SQUID designated by reference numeral 10, are illustrated with reference numeral 29, enclosed with a dashed circle as the SQUID bridging portion. The four-body interaction coupler 21 further includes a control line 51 that applies a magnetic flux to the SQUID from within the same plane. By varying a frequency of the microwave current supplied to the control line 51, a frequency variable coupler is provided (i.e., the four-body interaction coupler 21 functions as a frequency-variable coupler). The external magnetic flux given through the control line 51 from the current control part (not shown) penetrates through the SQUID loop of the four-body interaction coupler 21, thereby varying an effective self-inductance of the SQUID loop. As a result, the resonance frequency is varied.

In the variation example illustrated in FIG. 7, a distance between the electrodes and the ground (the GND plane 40) is reduced only partially in a vicinity of the SQUID bridging portion 29 of the electrode 16B and 18A. In the vicinity of the SQUID bridging portion 29, the control line 51 is provided to allow an external magnetic flux to be applied from the immediate vicinity of the SQUID bridging portion 29, as a result of which the magnetic flux through inductive coupling from the control line 51 can be efficiently applied. As described, it is preferable that the GND plane 40 is basically spaced apart from the electrodes 16 and 18. The GND plane 40 has a portion 30 (GND pattern protruding portion) in the vicinity of the SQUID bridging portion 29 that protrudes itself inwardly to be closer to the SQUID bridging portion 29. Thus, the length of the portion 30 is preferred to be ¼ or less of a circumference of an inner circumference of the GND plane 40 surrounding the electrodes 16 and 18. It may be ⅙ or less, and even more preferred ⅛ or less.

Figure 8:
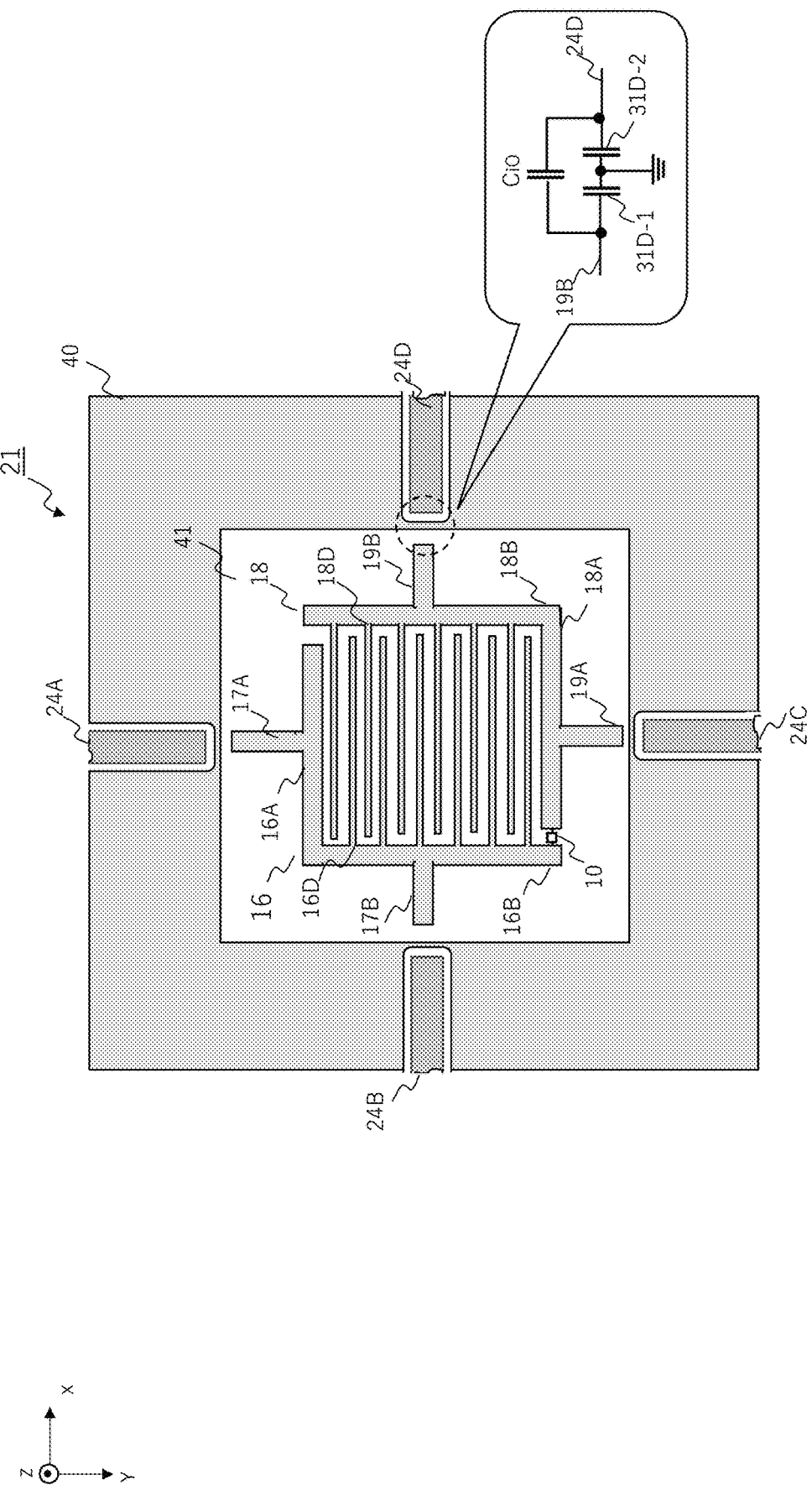
FIG. 8 is a diagram illustrating an example embodiment.

FIG. 8 is a diagram illustrating a coupler (four-body interaction coupler) 21 of another variation example. In FIG. 8, qubits (JPOs) 20A-20B are not shown and a planer circuit corresponding to the four-body interaction coupler 21 illustrated in FIG. 4 is illustrated. Referring to FIG. 8, the coupler 21 has a structure such that the GND plane 40 has a pattern (GND pattern) which penetrates between opposing portions 17A, 17B, 19A and 19B of comb-shaped electrodes 16 and 18 and connection portions 24A, 24B, 24C, 24D of JPOs 20A, 20B, 20C, and 20D for connecting to the coupler 21. For example, the connection portion 24D of the JPO 20D is connected via a capacitor 31D-2 to ground, and the opposing portion 19B of the electrode 18 is connected to ground via a capacitor 31D-1 (see equivalent circuit in a speech bubble). An equivalent circuit for a region (a region between the opposing portion 19B and the connection portion 24D) enclosed by a dashed circle in FIG. 8 is shown in the speech bubble in FIG. 8.

Electric lines of force between the connection portion 24D of the JPO 20D and the opposing portion 19B are shielded by ground (the GND pattern). Therefore, the circuit for the region enclosed by the dashed circle operates as a capacitor that has a smaller capacitance value than that of a configuration without the GND pattern penetrating between the connection portion 24D of the JPO 20D and the opposing portion 19B (illustrated in FIG. 7). When an electric field E is given, a curve whose tangent direction at a point on the curve coincides with the direction of E is called an electric line of force. Assume that density of electric lines of force per a unit vertical cross-sectional area is E and an area of the electrode of capacitor 31D-1 is S, then the number of electric lines of force is ES. The total number of lines of electric force between the electrodes of a capacitor (flat plate capacitor) in which a charge of Q[Coulomb] is stored is Q/ε (where ε is the dielectric constant) from Gauss's theorem. Therefore, Q is given by $$Q = \epsilon E \times S \quad (4)$$

Assume that a distance between the electrodes of the capacitor 31D-1 is d, and a voltage is V, we have E=V/d, then Q is given by $$Q = \epsilon \times (V/d) \times S = C \times V \quad (5)$$

(where, C=ε×S/d)

Assume that a first electrode (the opposing portion 19B) of the capacitor 31D-1 is surrounded by a conductor (the GND pattern 40) at ground potential. If the potential of the first electrode (the opposing portion 19B) is V1 and a charge Q1 is generated on the first electrode (the opposing portion 19B), then according to the theory (principle) of electrostatic shielding, a charge −Q1 is generated on a second electrode of the capacitor 31D-1 (the GND pattern 40 opposing the opposing portion 19B), whereas no charge is generated on the connection portion 24D, which corresponds to the outer conductor with respect to the opposing portion 19B. Similarly, if the potential of a first electrode (the connection portion 24D) of the capacitor 31D-2 (potential relative to ground) is V2 and a charge −Q2 is generated thereon, then a charge Q2 is generated on a second electrode of the capacitor 31D-2 (the GND pattern 40 opposing the connection portion 24D), whereas no charge is generated on the connection portion 19B corresponding to its outer conductor with respect to the connection portion 24D. Here, the following relation is hold with regard to charges on the GND pattern 40.

$$-Q1 + Q2 = 0 \quad (6)$$

therefore, $$Q2 = Q1 \quad (7)$$

Letting the capacitances of the capacitor 31D-1 and the capacitor 31D-2 be C1 and C2, respectively, Q1 and Q2 are given from the equation (5), $$Q1 = C1 \times V1 \quad (8)$$

$$Q2 = C2 \times V2 \quad (9)$$

where the combined capacitance of the capacitor 31D-1 and the capacitor 31D-2 is C'. Since the potential of the first electrode of the capacitor 31D-1 (the opposing portion 19B) is V1, the charge is +Q1, the potential of the first electrode of capacitor 31D-2 (the connection portion 24D) is V2, and the charge is −Q1, following equations hold.

$$Q1 = C' \times (V1 + V2) \quad (10)$$

$$C' = Q/(V1+V2) = Q/\{(Q/C1)+(Q/C2)\} = C1 \times C2/(C1+C2) \quad (11)$$

$$\therefore C' < C1, C' < C2 \quad (12)$$

The combined capacitance C' of the capacitors 31D-1 and 31D-2 is smaller than the capacitance value of the capacitors 31D-1 (31D-2) alone. Thus, according to the configuration with the GND pattern 40 penetrating between the connection portion 24 of the coupler of the JPO 20 and the opposing portion 19, the capacitance therebetween is smaller than the configuration without GND pattern (FIG. 7).

The capacitor 31D-2 allows only AC components of a signal from the connection portion 24D to pass through (cut off a DC component). This can be said that the DC voltage at its output is set (biased) to ground level (0V). The capacitor 31D-2 allows only AC components of a signal from the connection portion 24D to pass through (cut off the DC component) and the DC voltage at its output is fixed at ground level (0V). Therefore, a signal with only AC components and with a DC offset of the signal from the connection portion 24D level-shifted to 0 V is transmitted via the capacitor 31D-1 to the opposing portion 19B. Similarly, the capacitor 31D-1 allows only AC components of the signal from the opposing portion 19B to pass through while a DC offset voltage of the signal is fixed at ground level (0V). Therefore, a signal which has only AC components with the DC offset of the signal from the connection portion 24D level-shifted to 0 V is transmitted via the capacitor 31D-2 to the connection portion 19B. In the equivalent circuit in the speech bubble in FIG. 8, the capacitance Cio represents a direct capacitive coupling between the opposing portion 19B and the connection portion 24D, which is shielded by the ground (GND pattern 40).

In the variation examples, the spacing (gap) between each of the electrodes 16 and 18 and the GND pattern 40 that surrounds the electrodes 16 and 18 is at an extent of half the size of the electrodes 16 and 18, or less (order of the size is the same). That is, a gap between the lateral member 16A of the electrode 16 and the GND pattern 40 facing the lateral member 16A and the gap between the lateral member 18A of the electrode 18 and the GND pattern 40 facing the lateral member 18A are at an extent of ⅓ of the length of the longitudinal members 16B and 18B of the electrodes 16 and 18, respectively. A gap between the longitudinal member 16B of the electrode 16 and the GND pattern 40 facing the longitudinal member 16B and a gap between the longitudinal member 18B of the electrode 18 and the GND pattern 40 facing the longitudinal member 18B are at an extent of ⅓ of the length of the lateral members 16A and 18A of the electrodes 16 and 18, respectively. However, as in FIG. 7, the spacing (gap) between each of the electrodes 16 and 18 and the GND pattern 40 that surrounds the electrodes 16 and 18, may, as a matter of course, be comparable to, i.e., at an extent of the same size as, the size of the electrodes 16 and 18.

According to the planar structure in FIG. 8, the GND patterns 40 on both sides of the connection portions (24A-24D) in each JPO (20A-20D) for connecting to the four-body interaction coupler 21 are configured to be connected by a superconducting material without being divided at portions facing a connection portion (the opposing portions 17A, 17B, 19A, 19B) connecting the four-body interaction couplers 21 to each JPO (20A-20D). This is expected to have an effect such as reducing susceptibility to magnetic field noise.

Another Example Embodiment

In another example embodiment, a JPO's network is configured using four-body interaction couplers as the above-described example embodiment.

In the present example embodiment, a quantum annealer can be configured using the above-described network of JPOs. FIG. 3 and FIG. 4 illustrate a configuration of the quantum computer with four JPO 20s. By using the configuration illustrated in FIG. 3 and FIG. 4, etc. as a unit structure and connecting a plurality of these unit structures side by side, a quantum computer with an arbitrary number of JPO 20s integrated can be realized. In other words, a quantum computer may be configured having four JPOs and couplers that couple the resonators of each of these four JPOs with each other, respectively, as a unit structure.

Figure 9:
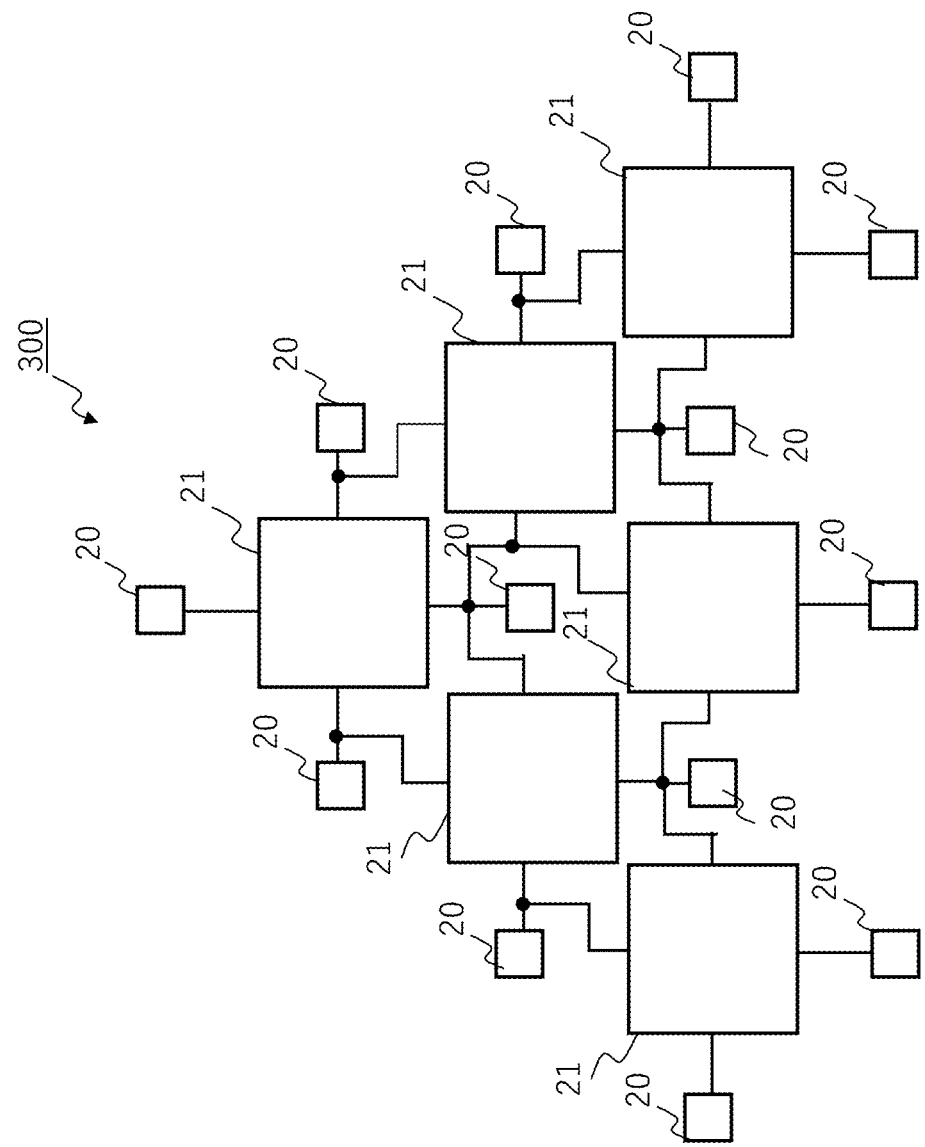
FIG. 9 is a diagram illustrating an example embodiment.

FIG. 9 is a schematic diagram of a quantum computer 300 (quantum annealing machine) with JPOs 20 integrated as a semiconductor device. In the configuration illustrated in FIG. 9, each four-body interaction coupler 21 is connected to neighboring (closed-packed) four JPOs 20, as illustrated in FIG. 4 and FIG. 6A, wherein four-body interaction coupler 21 and the neighboring (closed-packed) four JPOs 20 constitute a Lechner-Hauke-Zoller (LHZ) scheme unit cell.

Each JPO 20 is connected to 1-4 four-body interaction coupler(s) 21, and the JPO 20 is arranged to be shared by a plurality of unit structures to provide a configuration in which a plurality of unit structures illustrated in FIG. 4 and FIG. 6A are arranged. In the quantum computer 300, at least one JPO 20 is connected to a plurality of four-body interaction couplers 21. In particular, in the example shown in FIG. 9, at least one JPO 20 is connected to four four-body interaction couplers 21. The quantum computer 300 can also be described as follows. The quantum computer 300 is provided with a plurality of JPOs 20, each of which is connected to 1-4 four-body interaction coupler(s) 21. The number of the four-body interaction couplers 21 to which each JPO 20 connects corresponds to how many unit structures share the JPOs 20. Thus, in the example illustrated in FIG. 9, the quantum computer 300 is provided with a plurality of unit structures, and the plurality of unit structures share the JPO 20. In the example illustrated in FIG. 9, 13 superconducting nonlinear JPOs 20 are integrated, but any number of JPOs 20 can be integrated in a similar manner. Although a current control part and a readout part are not illustrated in FIG. 9 for ease of understanding of the drawing, the current control part and the readout part are actually used to control and read out the JPO 20.

The disclosure of each of PTL 1 and NPL 1 is incorporated herein by reference thereto. Variations and adjustments of the Exemplary embodiments and examples are possible within the scope of the overall disclosure (including the claims) of the present invention and based on the basic technical concept of the present invention. Various combinations and selections of various disclosed elements (including the elements in each of the claims, examples, drawings, etc.) are possible within the scope of the claims of the present invention. Namely, the present invention of course includes various variations and modifications that could be made by those skilled in the art according to the overall disclosure including the claims and the technical concept.

What is claimed is:

1. A superconducting quantum circuit, comprising:
   first to fourth qubits; and
   a coupler for four-body interaction among the first to fourth qubits,
   wherein the coupler includes, as a planer circuit configuration:
   first and second electrodes spaced apart from a ground plane disposed surrounding peripheries of the first and second electrodes, respectively, arranged opposing to each other; and
   a nonlinear element bridged between the first and second electrode, the nonlinear element including a Josephson junction,
   wherein the first electrode includes
   first and second opposing portions extended toward the first and second qubits, respectively from positions other than a side of the first electrode facing the second electrode,
   wherein the second electrode includes:
   third and fourth opposing portions extended toward the third and fourth qubits, respectively, from positions other than a side of the second electrode facing the first electrode, and
   wherein at least either one of:
   a gap between the first electrode and the ground plane facing the first electrode; and
   a gap between the second electrode and the ground plane facing the second electrode,
   includes a gap width of at least a value of a same extent as or a fraction of a size of the first electrode or the second electrode.

2. The superconducting quantum circuit according to claim 1, wherein the first and second electrodes are coupled via a first capacitance shunt-connected to the nonlinear element,
   the first and second opposing portions of the first electrode are coupled with the first and second qubits via a second and a third capacitance, respectively,
   the third and fourth opposing portions of the second electrode are coupled with the third and fourth qubits via a fourth and a fifth capacitance, respectively, and
   the first electrode and the second electrode are surrounded by the ground plane via a gap.

3. The superconducting quantum circuit according to claim 1, wherein the first electrode and the second electrode are configured to have, as a planer configuration, a trapezoid shape, both obliquely arranged with bottom sides thereof facing each other,
   the first and second opposing portions of the first electrode are extended from vicinities of two intersections of a top side and two oblique sides of a trapezoid of the first electrode toward the first and second qubits, respectively,
   the third and fourth opposing portions of the second electrode are extended from vicinities of two intersections of a top side and two oblique sides of a trapezoid of the second electrode toward the third and fourth qubits, respectively, and
   the nonlinear element is connected between an end portion of one of the two oblique sides of the trapezoid of the first electrode and an end portion of one of the two oblique sides of the trapezoid of the second electrode, both end portions facing each other.

4. The superconducting quantum circuit according to claim 1, wherein the first electrode includes:
   a first longitudinal member extending in a first direction; and
   a first lateral member extending from an end portion of the first longitudinal member in a second direction perpendicular to the first direction,
   the second electrode includes:
   a second longitudinal member extending in the first direction; and
   a second lateral member extending from an end portion of the second longitudinal member in the second direction,
   the first longitudinal member of the first electrode includes
   a plurality of first extension portions extending toward the second longitudinal member of the second electrode opposing the first longitudinal member of the first electrode,
   the second longitudinal member of the second electrode includes
   a plurality of second extension portions extending toward the first longitudinal member of the first electrode opposing the second longitudinal member of the second electrode,
   the plurality of first extension portions and the plurality of second extension portions are arranged to be nested within each other, and
   the nonlinear element is connected between an end portion of the first longitudinal member of the first electrode and an end portion of the second lateral member of the second electrode, both end portions facing each other.

5. The superconducting quantum circuit according to claim 1, comprising
   a ground pattern arranged between the first opposing portion of the first electrode and the first qubit and between the second opposing portion of the first electrode and the first qubit; and
   a ground pattern arranged between the third opposing portion of the second electrode and the third qubit and between the fourth opposing portion of the second electrode and the fourth qubit, and
   the first electrode, the first and second opposing portions of the first electrode, the second electrode, and the third and fourth opposing portions of the second electrode are all surrounded by the ground plane.

6. The superconducting quantum circuit according to claim 1, wherein in a case where at least one of:
   a gap width between the first electrode and the ground plane facing the first electrode, and
   a gap width between the second electrode and the ground plane facing the second electrode
   exceeds a value which is same as or one severalth of the size of the first electrode or the second electrode,
   an upper limit of the gap width is set to a value in a range such that the first and second opposing portions of the first electrode and the third and fourth opposing portions of the second electrode have a length of less than a few percent or a dozen percent of the propagating signal wavelength to make the coupler operate as a lumped element circuit.

7. The superconducting quantum circuit according to claim 1, wherein the nonlinear element of the coupler includes,
   a superconducting quantum interference device, SQUID, including a first superconducting line, a first Josephson junction, a second superconducting line, and a second Josephson junction connected in a loop; and a control line for generating a magnetic flux with a current fed thereto, the magnetic flux to penetrate through the loop of the SQUID.

8. The superconducting quantum circuit according to claim 1, wherein the first to fourth qubits include first to fourth Josephson parametric oscillators, respectively, each of the first to fourth Josephson parametric oscillator including:

an LC resonant circuit including a SQUID including a first superconducting line, a first Josephson junction, a second superconducting line, and a second Josephson junction connected in a loop; and a control line for generating a magnetic flux with a current fed thereto, the magnetic flux to penetrate through the loop of the SQUID.

9. The superconducting quantum circuit according to claim 7, wherein the control line is constituted by a coplanar structure with planar ground patterns arranged on both side of a signal line, the control line extended to a vicinity of the SQUID and terminated to a ground plane protruded up to the vicinity of the SQUID, the ground plane surrounding the coupler via gap.

10. The superconducting quantum circuit according to claim 8, wherein the control line is constituted by a coplanar structure with planar ground patterns arranged on both side of a signal line, one or more air bridges, each striding over the signal line to electrically connect the planar ground patterns on both side of the signal line.

11. The superconducting quantum circuit according to claim 8, wherein the first to fourth Josephson parametric oscillators are each constituted by lumped element type circuits.

12. The superconducting quantum circuit according to claim 11, wherein the first to fourth Josephson parametric oscillators each have an electrode with four arms of a cruciform, wherein first arms of the first to fourth Josephson parametric oscillators having ends coupling capacitively with the first to fourth opposing portions of the coupler, respectively, second arms of the first to fourth Josephson parametric oscillators having ends connected via the SQUIDs to a ground, respectively, and third arms of the first to fourth Josephson parametric oscillators having ends coupling capacitively with connection lines connecting to readout circuits, respectively.

13. The superconducting quantum circuit according to claim 8, wherein the first to fourth Josephson parametric oscillators are each constituted by distributed element type circuits.

14. The superconducting quantum circuit according to claim 8, wherein the first to fourth Josephson parametric oscillators and the coupler constitute a unit structure in a quantum computer.

15. The superconducting quantum circuit according to claim 14, comprising a plurality of the unit structures, wherein the quantum computer is configured such that at least one Josephson parametric oscillator among the first to fourth Josephson parametric oscillators included in one unit structure is shared by one or a plurality of other unit structures.

* * * * *